(12) United States Patent
Ivankovic et al.

(10) Patent No.: US 9,722,599 B1
(45) Date of Patent: Aug. 1, 2017

(54) DRIVER FOR THE HIGH SIDE SWITCH OF THE CASCODE SWITCH

(71) Applicant: Infineon Technologies Austria AG, Villach (AT)

(72) Inventors: Mladen Ivankovic, Oakville (CA); Fred Sawyer, Foxboro, MA (US)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 15/009,438

(22) Filed: Jan. 28, 2016

(51) Int. Cl.

| | |
|---|---|
| *H03K 17/60* | (2006.01) |
| *H03K 17/567* | (2006.01) |
| *H03K 17/74* | (2006.01) |
| *H03K 17/691* | (2006.01) |
| *H03K 7/08* | (2006.01) |
| *H03K 17/22* | (2006.01) |

(52) U.S. Cl.
CPC ............. *H03K 17/567* (2013.01); *H03K 7/08* (2013.01); *H03K 17/223* (2013.01); *H03K 17/691* (2013.01); *H03K 17/74* (2013.01); *H03K 2017/226* (2013.01)

(58) Field of Classification Search
CPC .................................................. H30K 17/567
USPC ......................................................... 327/432
See application file for complete search history.

(56) References Cited

U.S. PATENT DOCUMENTS

| | | | | |
|---|---|---|---|---|
| 5,313,109 | A * | 5/1994 | Smith | H02M 3/335 327/108 |
| 6,257,216 | B1 * | 7/2001 | Forster | F02P 3/0435 123/650 |
| 8,653,881 | B2 | 2/2014 | Ivankovic | |
| 8,779,841 | B2 | 7/2014 | Ivankovic | |
| 9,041,433 | B2 * | 5/2015 | Ausseresse | H03K 3/01 323/282 |
| 9,281,813 | B2 * | 3/2016 | Ivankovic | |
| 2009/0140791 | A1 * | 6/2009 | Young | H03K 17/163 327/419 |
| 2014/0035627 | A1 * | 2/2014 | Dunipace | H03K 3/012 327/109 |

\* cited by examiner

*Primary Examiner* — Lincoln Donovan
*Assistant Examiner* — Metasebia Retebo
(74) *Attorney, Agent, or Firm* — Slater Matsil, LLP (57) ABSTRACT

In accordance with an embodiment, a circuit includes a first and a second switching transistors configured to be coupled in series between a first reference voltage terminal and a transformer. The circuit also includes a first diode coupled between a first drain of the first switching transistor and a first input terminal. The first diode is configured to clamp a voltage of the first drain to a voltage of the first input terminal. The circuit further includes a switching circuit coupled between the second switching transistor and the first input terminal. The switching circuit is configured to connect a second source of the second switching transistor to a second gate of the second switching transistor when a voltage of the second source exceeds the voltage of the first input terminal.

30 Claims, 4 Drawing Sheets

DRIVER FOR THE HIGH SIDE SWITCH OF THE CASCODE SWITCH

TECHNICAL FIELD

The present disclosure relates generally to switches, in particular cascode switches.

BACKGROUND

Power supply systems are pervasive in many electronic applications from computers to automobiles. Generally, voltages within a power supply system are generated by performing a DC-DC, DC-AC, and/or AC-DC conversion by operating a switch loaded with an inductor or transformer. One class of such systems includes switched mode power supplies (SMPS). An SMPS is usually more efficient than other types of power conversion systems because power conversion is performed by controlled charging and discharging of the inductor or transformer and reduces energy lost due to power dissipation across resistive voltage drops.

A SMPS usually includes at least one switch and an inductor or transformer. Some specific topologies include buck converters, boost converters, and flyback converters, among others. A control circuit is commonly used to open and close the switch to charge and discharge the inductor. In some applications, the current supplied to the load and/or the voltage supplied to the load is controlled via a feedback loop. In some typologies, the switches used in the SMPS are implemented using cascode switches.

Cascode switches are typically designed with two or more MOSFETs (metal oxide semiconductor field effect transistors) or IGBTs (insulated gate bipolar transistors) connected in series. For example in a two transistor cascode switch, the first transistor is coupled to the load and the second transistor is coupled in series between the first transistor and ground. The transistors are switched on and off in order to switch the load current as demanded or required. The load voltage is distributed across all of the series connected power transistors included in the cascode switch. For example, two 800V rated MOSFETs may be connected in series for switching a 1000V or greater load.

SUMMARY OF THE INVENTION

In accordance with an embodiment, a circuit including a first switching transistor having a first source coupled to a first reference voltage terminal, and a second switching transistor having a second source coupled to a first drain of the first switching transistor, and a second drain configured to be coupled to a transformer. The circuit also includes a first diode coupled between the first drain of the first switching transistor and a first input terminal. The first diode is configured to clamp a voltage of the first drain of the first switching transistor to a voltage of the first input terminal. The circuit further includes a switching circuit coupled between the second switching transistor and the first input terminal. The switching circuit is configured to connect the second source of the second switching transistor to a second gate of the second switching transistor when a voltage of the second source of the second switching transistor exceeds the voltage of the first input terminal.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for cascode switches that may be used in power converters (e.g., flyback converters) to switch on and off the load current. The invention may also be applied to other systems and applications having circuits that utilize cascode switches.

Flyback converters generally include a switch coupled in series with a primary winding of a transformer and an input voltage of the flyback converter. During operation of the flyback converter when the switch is turned off, the voltage across the switch may rise to a very high voltage that is much greater than then the input voltage, which may be on the order of a few hundred volts. In order to help the switch withstand these high voltages, the switch is constructed using a plurality of connected transistors that share the high voltage between them. According to embodiments of the present invention, a cascode switch is constructed using a low-side switching transistor and a high-side cascode transistor. When the cascode switch is turned off, the load-path voltage of the low-side switching transistor is clamped to input voltage of the flyback converter while the cascode transistor is permitted to conduct. Once the drain of the low-side is clamped to the input voltage of the flyback converter, the cascode transistor is turned-off. This way, the voltage across the low-side switching transistor limited to about the voltage of the power input bus of the flyback converter and the high-side cascode transistor is about limited to a voltage difference between the maximum voltage seen across the switch and the power input bus of the flyback converter. In some embodiments, the maximum voltage across each device in the cascode switch is substantially independent of device geometry, device parameters, parasitic capacitance and device matching between the low-side switching transistor and the high-side cascode transistor. Advantageously, in such embodiments, the low-side switching transistor and the high-side cascode transistor do not need to be over-specified to withstand the full voltage seen by the switch in some embodiments, yielding the ability to use smaller, less expensive transistors for the cascode switch. In addition, in some embodiments, the turn-off time of the cascode switch is substantially independent of the load current of the cascode switch.

Figure 1:
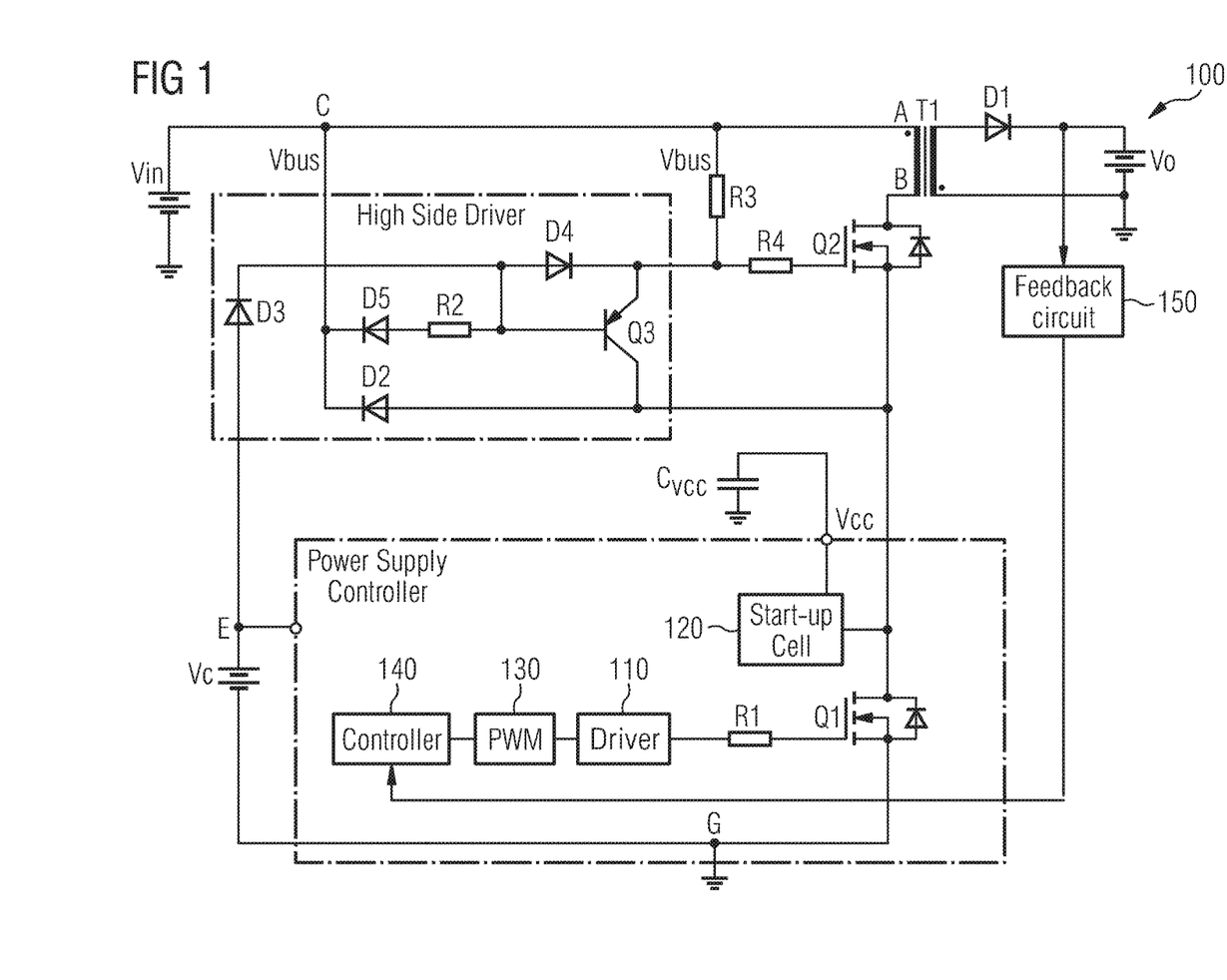
FIG. 1 illustrates a power converter with a cascode switch in some embodiments.

FIG. 1 illustrates a switched-mode flyback converter 100 using a cascode switch that includes transistors $Q_1$ and $Q_2$, in accordance with some embodiments. A flyback converter is illustrated in FIG. 1 an example. The use of a flyback converter in FIG. 1 is not intended to be limiting, as other suitable circuits and/or power converters may also be used with the cascode switch. The discussion below may refer to the power converter as a flyback converter, with the understanding that other types of power converter or circuits may also be used with the cascode switch disclosed herein.

Referring to FIG. 1, two switching transistors $Q_1$ and $Q_2$ are coupled in series between transformer $T_1$ of flyback converter 100 and a reference voltage terminal G. The reference voltage terminal G is coupled to electrical ground, but may be coupled to other reference potentials in alternative embodiments. As illustrated in FIG. 1, switching transistor $Q_2$ is coupled between the primary winding of transformer $T_1$ and switching transistor $Q_1$, with the drain of switching transistor $Q_2$ coupled to terminal B of the primary winding of transformer $T_1$, and the source of switching transistor $Q_2$ coupled to the drain of switching transistor $Q_1$. The source of switching transistor $Q_1$ is coupled to reference voltage terminal G. In the discussion hereinafter, the switching transistor (e.g., transistor $Q_1$) closest to reference voltage terminal G may be referred to as the low-side transistor and switching transistor (e.g. transistor $Q_2$) closest to the transformer may be referred to as the high-side transistor.

As shown in FIG. 1, an input voltage $V_{in}$ is supplied to an input terminal C of circuit 100. In FIG. 1, the input voltage $V_{in}$ is shown as a DC voltage source for the purpose of illustration, however, one skilled in the art will appreciate that other suitable input voltages, such as a rectified AC voltage, may also be used as the input voltage. Terminal A of the primary winding of transformer $T_1$ is coupled to input terminal C, thus input voltage $V_{in}$ is also applied to terminal A of the primary winding of transformer $T_1$. The voltage at input terminal C and terminal A of the primary winding of transformer $T_1$ is sometimes referred to as the bus voltage. The secondary winding of transformer $T_1$ is coupled to a load represented by voltage $V_o$ via a rectifier diode $D_1$, in some embodiments.

FIG. 1 illustrates a driver circuit 110, also referred to as a driver 110, that is coupled to the gate of low-side transistor $Q_1$. An input terminal of the driver 110 of low-side transistor $Q_1$ may be coupled to a pulsed voltage source, such as a pulse-width-modulator (PWM) 130. In the discussion below, a PWM is also used to refer to a pulsed voltage source and may be used interchangeably with a pulsed voltage source. PWM 130 may be coupled to and controlled by a controller 140. Controller 140 may be a micro-controller unit (MCU), an application-specific integrated circuit (ASIC), a control circuit built using discrete components, or any other suitable controller. As shown in FIG. 1, controller 140 may receive feedback signal(s) from feedback circuit 150 to monitor the operation and status of circuit 100. Controller 140 may instruct PWM 130 to generate a pulse train (e.g., a series of voltage pulses with desired pulse width and pulse amplitude) to turn on and off low-side transistor $Q_1$, which in turn causes high-side transistor $Q_2$ to turn on and off, as discussed in more detail hereinafter. The driver of low-side transistor $Q_1$ may comprises any suitable driver circuit.

Still referring to FIG. 1, the gate of high-side transistor $Q_2$ is coupled to a high-side driver via resistor $R_4$. The high-side driver is shown in another dashed box illustrated in FIG. 1, and includes diodes $D_2$, $D_3$, $D_4$, $D_5$, resistor $R_2$, and transistor $Q_3$, in some embodiments. Transistor $Q_3$ is a bipolar junction transistor (BJT), in various embodiments. As illustrated in FIG. 1, the emitter of BJT transistor $Q_3$ is coupled to the gate of high-side transistor $Q_2$ via resistor $R_4$, the collector of BJT transistor $Q_3$ is coupled to the source of high-side transistor $Q_2$, and the base of BJT transistor $Q_3$ is coupled to the input terminal C via diode $D_5$ and resistor $R_2$, with resistor $R_2$ coupled between diode $D_5$ and transistor $Q_3$. In addition, FIG. 1 further illustrates diode $D_2$ coupled between the drain of low-side transistor $Q_1$ and input terminal C, diode $D_4$ coupled between the base and the emitter of BJT transistor $Q_3$, and diode $D_3$ coupled between diode $D_4$ and a voltage terminal E that is coupled to a voltage source $V_c$. In the example of FIG. 1, voltage source $V_c$ is a DC voltage source, although other suitable voltage source (e.g., a pulsed voltage source) may also be used. Furthermore, as illustrated in FIG. 1, a first terminal of resistor $R_3$ is coupled to input terminal C, and a second terminal of resistor $R_3$ is coupled to the gate of high-side transistor $Q_2$ via resistor $R_4$, in some embodiments.

Operation of the cascode switch is described now with reference to FIG. 1. Referring to FIG. 1, during turn on of the cascode switch, PWM 130 generates a voltage pulse (e.g., a voltage pulse of 10 volt with a pulse width of 10 μs) to turn on low-side transistor $Q_1$. Once low-side transistor $Q_1$ is turned on, the source voltage of high-side transistor $Q_2$ is pulled down to a low voltage (e.g., close to electrical ground). Since the gate of high-side transistor $Q_2$ is coupled to voltage source $V_c$ (e.g., a DC voltage source of 15 volt), rectifier diode $D_3$ and $D_4$ begin to conduct. In the conducting state, rectifier diode $D_3$ and $D_4$ charge high-side transistor $Q_2$ through resistor $R_4$, thus turning on high-side transistor $Q_2$. Once low-side transistor $Q_1$ and high-side transistor $Q_2$ are turned on, load current flows through the primary winding of transformer $T_1$, low-side transistor $Q_1$ and high-side transistor $Q_2$. During the turn on process, BJT transistor $Q_3$ is off because the base-emitter voltage ($V_{be}$) of $Q_3$ is negative.

Still referring to FIG. 1, during turn off of the cascode switch, PWM 130 generates a corresponding voltage pulse (e.g., a voltage pulse with zero volt and pulse width of 4 μs) to turn off low-side $Q_1$, which in turn causes the drain-to-source voltage ($V_{ds}$) of $Q_1$ to begin rising. When $V_{ds}$ of low-side transistor $Q_1$ reaches a threshold voltage, e.g., a diode's drop above the bus voltage, rectifier diode $D_2$ conducts and load current is redirected through $D_2$. Once conducting, diode $D_2$ clamps the drain-to-source voltage of low-side transistor $Q_1$ to the bus voltage. One skilled in the art will appreciate that "clamp to the bus voltage" means that the drain-to-source voltage $V_{ds}$ of low-side transistor $Q_1$ is limited to a voltage near the bus voltage, e.g., a diode drop above the bus voltage. Since the drain-to-source voltage $V_{ds}$ of low-side transistor $Q_1$ is clamped at bus voltage, the gate voltage of high-side transistor $Q_2$ is above bus voltage. As a result, diodes $D_4$ becomes reverse biased, diode $D_5$ becomes forward biased, and BJT transistor $Q_3$ conducts. Once BJT transistor $Q_3$ conducts, load current flows through resistor $R_4$, BJT transistor $Q_3$, resistor $R_2$ and diode $D_5$ to discharges the gate-source capacitor $C_{gs}$ of high-side transistor $Q_2$, turning off $Q_2$. Therefore, the primary winding, high-side transistor $Q_2$, resistor $R_4$, BJT transistor $Q_3$, resistor $R_2$ and diode $D_5$ form a conductive loop to discharge the gate-source capacitor $C_{gs}$, in some embodiments. The high-side transistor $Q_2$ turns off when $C_{gs}$ is discharged. Note that when BJT transistor $Q_3$ conducts (e.g., when the source of high-side transistor $Q_2$ is above the bus voltage), its emitter and base are forward biased and its collector and base are reverse biased, current flows through the emitter and collector, therefore BJT transistor $Q_3$ connects the gate and the source of high-side transistor $Q_2$ when conducting, in accordance with some embodiments. In the discussion hereinafter, the BJT transistor $Q_3$, resistor $R_2$ and diode $D_5$ may be collectively referred to as a switching circuit. As discussed above, the low-side transistor $Q_1$ and high-side transistor $Q_2$ turn off successively, in some embodiments.

Since high-side transistor $Q_2$ is actively turned off by BJT transistor $Q_3$ independently of load current, the turn off time of high-side transistor $Q_2$ does not depend on the load current, meaning that compared with the case of a single transistor, the circuit topology does not result in any additional dependency of turn off time on load current. This illustrates an advantage of the present disclosure.

Still referring to FIG. 1, as mentioned above, when the cascode switch is turned on, load current flows through the primary winding of transformer $T_1$ Diode $D_1$ of the secondary winding of transformer $T_1$ is reverse biased when the cascode switch is on, therefore, no current flows through the secondary winding, and the load current flows through the primary winding and stores energy as magnetic field in the transformer. Diode D1 may be replaced by a switch that is used as a synchronous rectifier, as skilled artisans will appreciate. After the cascode switch is turned off (e.g., after high-side transistor $Q_2$ is turned off), the stored magnetic field collapses, and energy is transferred to the output of the transformer (e.g., the secondary winding), generating an output voltage across the secondary winding and a current in the secondary winding. Due to the electromagnetic coupling between the primary winding and the secondary winding, the output voltage across the secondary winding is reflected back to the primary winding, thus the cascode switch may be subject to a high load voltage. In some embodiments, the high load voltage is equal to a sum of the bus voltage and a reflected voltage, which reflected voltage is determined, at least in part, by the output voltage across the secondary winding and the winding ratio between the primary winding and the second winding. As discussed above, diode $D_2$ clamps the drain-to-source voltage $V_{ds}$ of low-side transistor $Q_1$ to the bus voltage, thus high-side transistor $Q_2$ is subject to the rest of the load voltage. Therefore, the voltage rating, which defines the maximum voltage under which a transistor can safely operate, may be different for low-side transistor $Q_1$ and high-side transistor $Q_2$. For example, low-side transistor $Q_1$ may have a first voltage rating, and high-side transistor $Q_2$ may have a second voltage rating different from the first voltage rating. The first and the second voltage ratings may be pre-determined based on various factors such as the bus voltage, winding ratio of the transformer, and the output voltage across the secondary winding. In other embodiments, the first voltage rating and the second voltage rating are the same.

Advantages of the different voltage ratings for switching transistors $Q_1$ and $Q_2$ include the flexibility in choosing the transistors for use as switching transistor $Q_1$ and $Q_2$, and cost saving due to the ability to use transistors with lower voltage rating (e.g., cheaper transistors). The embodiment cascode switch in, e.g., FIG. 1, has pre-determined voltage ratings for switching transistor $Q_1$ and $Q_2$ that are independent of parasitic capacitances of transistors $Q_1$ and $Q_2$. This allows greater flexibility in the selection of transistors. For example, not only can transistors of the same type manufactured in different batches be used as switching transistor $Q_1$ and $Q_2$, but also can transistors of different types be used (see FIG. 5 and the discussion therewith below). In some embodiments, the voltage ratings for switching transistors $Q_1$ and $Q_2$ do not have to accommodate the worse scenario parasitic capacitance variations, thus lower voltage ratings, hence cheaper transistors, can be used in the cascode switches disclosed in the present disclosure.

By adding resistor $R_3$ coupled between input terminal C and the gate of high-side transistor $Q_2$ as shown in FIG. 1, a start-up cell 120 could be coupled to the source of high-side transistor $Q_2$. Since the drain of low-side transistor $Q_1$ is coupled to the source of high-side transistor $Q_2$, start-up cell 120 is also coupled to the drain of low-side transistor $Q_1$, in various embodiments. In some embodiments, start-up cell 120 provides a stable supply voltage $V_{cc}$ to module(s) of circuit 100 (e.g., the power supply controller), before input voltage $V_{in}$ at the input terminal C is fully applied and stabilized, so that modules such as the power supply controller can perform the necessary regulation. Once the input voltage stabilizes, start-up cell 120 becomes inactive unless power is interrupted. A start-up cell normally has an internal switch, e.g., a depletion mode MOSFET, and a driver stage. Start-up cell 120 might include circuits that limit the charge current below a pre-determined maximum value. During the start-up process, a charge current flows through the internal switch to charge a capacitor coupled to a $V_{CC}$ terminal before the stabilization of the input voltage. As shown below, high-side transistor $Q_2$ could be used to charge the capacitor $C_{vcc}$ coupled to the $V_{cc}$ terminal (see FIG. 1) and be used a part of the start-up cell.

Referring to FIG. 1, during start up of circuit 100, input voltage $V_{in}$ applied at input terminal C turns on high-side transistor $Q_2$ via resistors $R_3$ and $R_4$, thus allowing a charging current to flow through high-side transistor $Q_2$ and start-up cell 120 to charge capacitor $C_{vcc}$ at the $V_{cc}$ terminal. This allows start-up cell 120 to generate voltage $V_{cc}$ used by other modules (e.g., the power supply controller) of circuit 100 for proper operation of circuit 100 during the start-up process. Therefore, by adding resistor $R_3$ in circuit 100, high-side transistor $Q_2$ could be used as a part of the start-up cell, this illustrates another advantage of the current disclosure. In some embodiments, driver 110 for low-side transistor $Q_1$, PWM 130, controller 140, start-up cell 120 and other related circuits (not shown) form the power supply controller of circuit 100, which is illustrated by the dashed box in FIG. 1.

Figure 2:
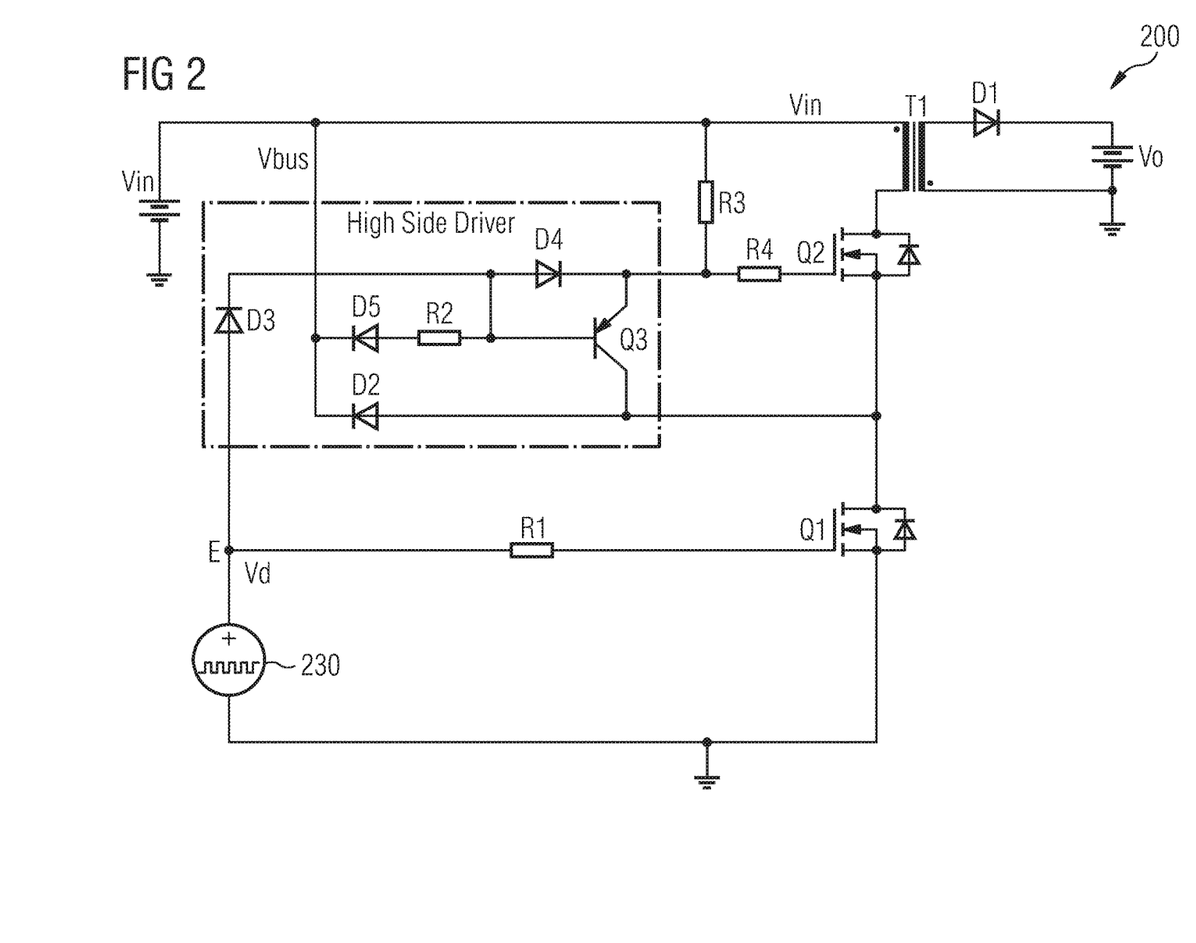
FIG. 2 illustrates a power converter circuit with a cascode switch in some other embodiments.

FIG. 2 illustrates another embodiment circuit 200 having a power converter with a cascode switch. Circuit 200 is similar to circuit 100 illustrated in FIG. 1, with similar numbers denote similar components. In FIG. 2, a resistor $R_1$ is coupled to the gate of low-side transistor $Q_2$. A difference between FIG. 1 and FIG. 2 is that both low-side transistor $Q_1$ and high-side transistor $Q_2$ in FIG. 2 are coupled to the same voltage terminal E, which is coupled to voltage source $V_d$, in accordance with some embodiments. In various embodiments, voltage source $V_d$ is a PWM 230. Although not shown, PWM 230 in FIG. 2 may be controlled by a controller in a similar fashion as illustrated in FIG. 1. In addition, although not shown in FIG. 2, a start-up cell similar to the one shown in FIG. 1 could be coupled to the drain of low-side transistor $Q_1$. In FIG. 2, no start-up cell is coupled to the drain of low-side transistor $Q_1$, therefore resistor $R_3$ in FIG. 2 becomes optional and could be omitted from circuit 200. Operation of the cascode switch in FIG. 2 is similar to that of FIG. 1 discussed above, as one skilled in the art will readily appreciate.

Figure 3:
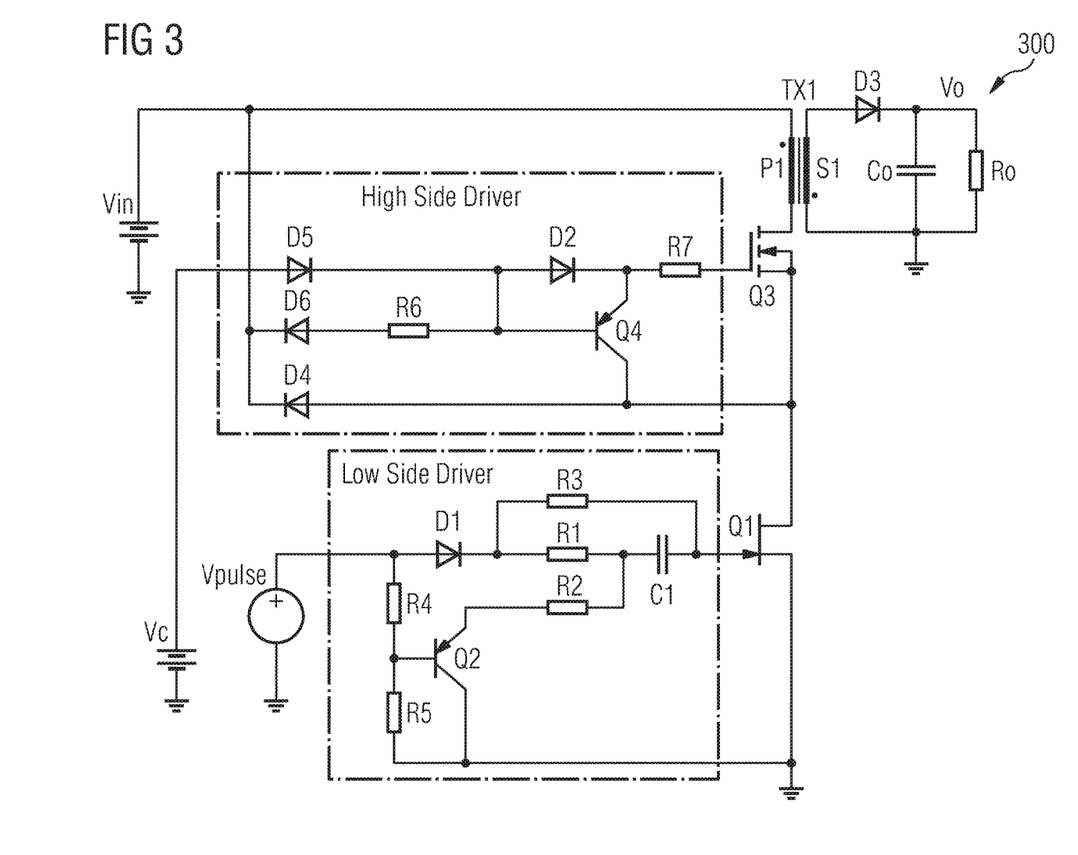
FIG. 3 illustrates a power converter circuit with a cascode switch in yet other embodiments.

FIG. 3 illustrates yet another embodiment circuit 300 having a power converter with a cascode switch. In FIG. 3, circuit 300 comprises a high-side transistor $Q_3$, which may be a first type of transistor, e.g., a MOSFET. High-side transistor $Q_3$ may have a first voltage rating. The gate of high-side transistor $Q_3$ is coupled to a high-side driver, which may be similar to the high-side driver illustrated in FIG. 1. As illustrated in FIG. 3, circuit 300 also includes a low-side transistor $Q_1$, which may be a second type of transistor different from high-side transistor $Q_3$. For example, low-side transistor may be a Gallium Nitride field-effect transistor (GaN FET). In some embodiments, the low-side transistor $Q_1$ has a second voltage rating, which may be different from the first voltage rating of high-side transistor $Q_3$. For example, high-side transistor $Q_3$ may have a voltage rating of 800 volt, while low-side transistor $Q_1$ may have a voltage rating of 500 volt. As another example, high-side transistor $Q_3$ may have a voltage rating of 500 volt, while low-side transistor $Q_1$ may have a voltage rating of 800 volt. The ability to choose transistors of different types and/or different voltage ratings is another advantage of the present disclosure, as discussed above with reference to FIG. 1. In other embodiments, the high-side transistor $Q_3$ and low-side transistor $Q_1$ are the same type of transistors and/or have similar or the same voltage ratings.

As illustrated in FIG. 3, circuit 300 includes a low-side driver coupled between the gate of low-side transistor $Q_1$ and a voltage source, which voltage source may be a PWM. The low-side driver comprises a transistor $Q_2$, capacitor $C_1$, diode $D_1$, and resistors $R_1$, $R_2$, $R_3$, $R_4$ and $R_5$, in some embodiments. The transistor $Q_2$ may be a BJT transistor, for example. Operation of the cascode switch in FIG. 3 is similar to that of FIG. 1 discussed above, as one skilled in the art will readily appreciate.

Figure 4:
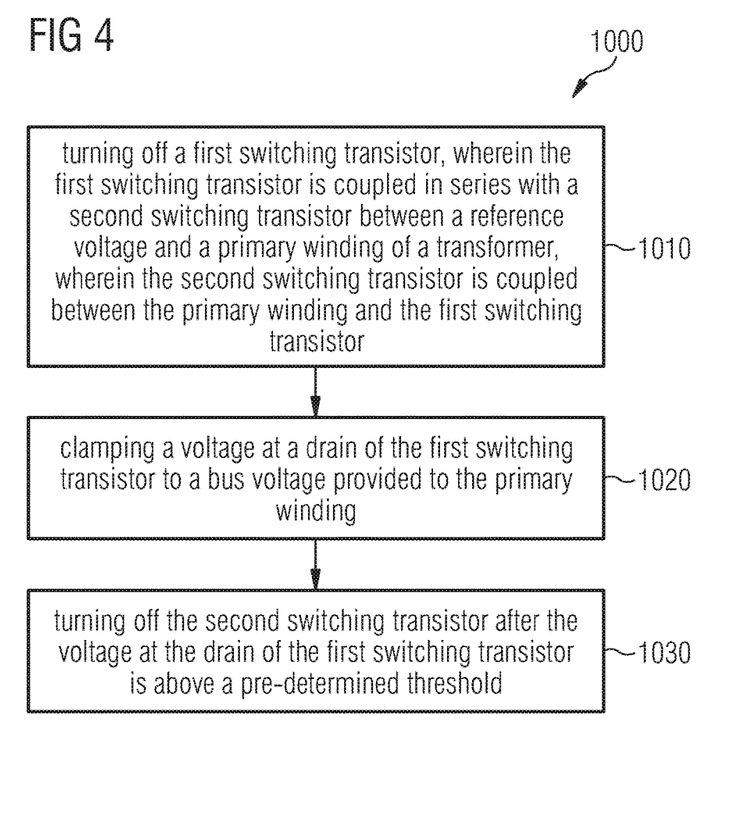
FIG. 4 illustrates a flow chart of a method for switching a power circuit in some embodiments.

FIG. 4 illustrates a flow chart of a method of switching a power circuit, in accordance with some embodiments. It should be understood that the embodiment method shown in FIG. 4 is an example of many possible embodiment methods. One of ordinary skill in the art would recognize many variations, alternatives, and modifications. For example, various steps as illustrated in FIG. 4 may be added, removed, replaced, rearranged and repeated.

Referring to FIG. 4, at step 1010, a first switching transistor is turned off. The first switching transistor is coupled in series with a second switching transistor between a reference voltage and a primary winding of a transformer. The second switching transistor is coupled between the primary winding and the first switching transistor. At step 1020, a voltage at a drain of the first switching transistor is clamped to a bus voltage provided to the primary winding. At step 1030, second switching transistor is turned off after the voltage at the drain of the first switching transistor is above a pre-determined threshold.

Embodiments of the present invention are summarized here. Other embodiments can also be understood form the entirety of the specification and the claims filed herein. One general aspect includes a circuit including a first switching transistor having a first source coupled to a first reference voltage terminal, and a second switching transistor having a second source coupled to a first drain of the first switching transistor, and a second drain configured to be coupled to a transformer. The circuit also includes a first diode coupled between the first drain of the first switching transistor and a first input terminal. The first diode is configured to clamp a voltage of the first drain of the first switching transistor to a voltage of the first input terminal. The circuit further includes a switching circuit coupled between the second switching transistor and the first input terminal. The switching circuit is configured to connect the second source of the second switching transistor to a second gate of the second switching transistor when a voltage of the second source of the second switching transistor exceeds the voltage of the first input terminal.

Implementations may include one or more of the following features. The switching transistor further includes a third transistor having a first terminal coupled to the second gate of the second switching transistor, and having a second terminal coupled to the second source of the second switching transistor. The switching transistor may also include a first resistor and a second diode coupled in series between a third terminal of the third transistor and the first input terminal. In some embodiments, the third transistor is a bipolar junction transistor (BJT), the first terminal is an emitter of the BJT, the second terminal is a collector of the BJT, and the third terminal is a base of the BJT. In some embodiments, the circuit further includes a third diode coupled between the base and the emitter of the BJT, and a fourth diode coupled between the third diode and a first voltage terminal. The circuit may further include a DC voltage source coupled to the first voltage terminal. The circuit may further include a pulse width modulator coupled to the first voltage terminal.

In some embodiments, the circuit further includes a first driver circuit coupled to a first gate of the first switching transistor. The first driver circuit may comprise a resistor. In some embodiments, the circuit further includes a pulse width modulator coupled to the first driver circuit.

In various embodiments, the circuit includes a second resistor coupled between the second gate of the second switching transistor and the emitter of the BJT. The circuit may further include a third resistor coupled between the emitter of the BJT and the first input terminal. The circuit may further include a start-up cell coupled to the second source of the second switching transistor.

In accordance with some embodiments, the first switching transistor and the second switching transistor are different types of transistors. In other embodiments, a first one of the first and the second switching transistors is a metal-oxide-semiconductor field-effect transistor (MOSFET), and a second one of the first and the second switching transistors is a Gallium Nitride field-effect transistor (GaN FET). In yet other embodiments, the circuit includes the transformer.

Another general aspect includes a circuit including a first switching transistor and a second switching transistor, where a drain of the first switching transistor is coupled to a source of the second switching transistor, a source of the first switching transistor is coupled to a reference voltage terminal, and a drain of the second switching transistor is configured to be coupled to a first terminal of a primary winding of a transformer. The circuit also includes a first diode coupled between the drain of the first switching transistor and a second terminal of the primary winding, where the first diode is configured to limit a voltage at the drain of the first switching transistor to a pre-determined voltage. The circuit further includes a switching circuit coupled between the second switching transistor and the second terminal of the primary winding, where the switching circuit is configured to discharge a gate-source capacitor of the second switching transistor when the voltage at the drain of the first switching transistor is at the pre-determined voltage.

Implementations may include one or more of the following features. The switching circuit may include a bipolar junction transistor (BJT) comprising an emitter coupled to a gate of the second switching transistor, and a collector coupled to the source of the second switching transistor, and a first resistor and a second diode coupled in series between a base of the BJT and the second terminal of the primary winding. The circuit may further include a third diode; and a fourth diode, wherein the fourth diode and the third diode are coupled in series between the emitter of the BJT and a first voltage terminal. The first voltage may be coupled to a DC voltage source. The first voltage terminal may be coupled to a pulse width modulator. The circuit may include a driver circuit coupled between a gate of the first switching transistor and a pulse width modulator.

In some embodiments, the circuit also includes a second resistor coupled between the emitter of the BJT and the gate of the second switching transistor. The circuit may further include a third resistor coupled between the emitter of the BJT and the second terminal of the primary winding. The circuit may further include a start-up cell coupled to the source of the second switching transistor.

In various embodiments, the first switching transistor and the second switching transistor have different voltage ratings. In other embodiments, the circuit further includes the transformer.

A further general aspect includes a method of switching a power circuit including turning off a first switching transistor, where the first switching transistor is coupled in series with a second switching transistor between a reference voltage and a primary winding of a transformer, where the second switching transistor is coupled between the primary winding and the first switching transistor. The method also include clamping a voltage at a drain of the first switching transistor to a bus voltage provided to the primary winding, and turning off the second switching transistor after the voltage at the drain of the first switching transistor is above a pre-determined threshold.

Implementations may include one or more of the following features. In some embodiments, the clamping is performed by a diode coupled between the drain of the first switching transistor and the primary winding. The turning off the second switching transistor may include turning on a third transistor, and discharging a gate-source capacitor of the second switching transistor through a conductive path including the third transistor, a resistor, and a second diode. In an embodiment, the third transistor is a bipolar junction transistor (BJT).

Advantages of embodiments of the present invention include a turn off time for high-side transistors that is independent of load current, the ability to use transistors of different types and/or different voltage ratings for the high-side transistor and the low-side transistor. In addition, it is possible to use the high-side transistor as a part of a start-up cell. If quasi-resonant mode of operation is used, both the low-side transistor and the high-side transistor can be turned off quickly, thus minimizing turn-off loss.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:
1. A circuit comprising:
   a first switching transistor comprising a first source coupled to a first reference voltage terminal;
   a second switching transistor comprising a second source coupled to a first drain of the first switching transistor, and a second drain configured to be coupled to a transformer;
   a first diode coupled between the first drain of the first switching transistor and a first input terminal, wherein the first diode is configured to clamp a voltage of the first drain of the first switching transistor to a voltage of the first input terminal; and
   a switching circuit coupled between the second switching transistor and the first input terminal, wherein the switching circuit is configured to connect the second source of the second switching transistor to a second gate of the second switching transistor when a voltage of the second source of the second switching transistor exceeds the voltage of the first input terminal.

2. The circuit of claim 1, wherein the switching circuit comprises:
   a third transistor having a first terminal coupled to the second gate of the second switching transistor, and having a second terminal coupled to the second source of the second switching transistor; and
   a first resistor and a second diode coupled in series between a third terminal of the third transistor and the first input terminal.

3. The circuit of claim 2, wherein the third transistor is a bipolar junction transistor (BJT), the first terminal is an emitter of the BJT, the second terminal is a collector of the BJT, and the third terminal is a base of the BJT.

4. The circuit of claim 3, further comprising:
   a third diode coupled between the base and the emitter of the BJT; and
   a fourth diode coupled between the third diode and a first voltage terminal.

5. The circuit of claim 4, further comprising a DC voltage source coupled to the first voltage terminal.

6. The circuit of claim 4, further comprising a pulse width modulator coupled to the first voltage terminal.

7. The circuit of claim 4, further comprising a first driver circuit coupled to a first gate of the first switching transistor.

8. The circuit of claim 7, wherein the first driver circuit comprises a resistor.

9. The circuit of claim 7, further comprising a pulse width modulator coupled to the first driver circuit.

10. The circuit of claim 3, further comprising a second resistor coupled between the second gate of the second switching transistor and the emitter of the BJT.

11. The circuit of claim 10, further comprising a third resistor coupled between the emitter of the BJT and the first input terminal.

12. The circuit of claim 11, further comprising a start-up cell coupled to the second source of the second switching transistor.

13. The circuit of claim 1, wherein the first switching transistor and the second switching transistor are different types of transistors.

14. The circuit of claim 1, wherein a first one of the first and the second switching transistors is a metal-oxide-semiconductor field-effect transistor (MOSFET), and a second one of the first and the second switching transistors is a Gallium Nitride field-effect transistor (GaN FET).

15. The circuit of claim 1, further comprising the transformer.

16. A circuit comprising:
   a first switching transistor and a second switching transistor, wherein a drain of the first switching transistor is coupled to a source of the second switching transistor, a source of the first switching transistor is coupled to a reference voltage terminal, and a drain of the second switching transistor is configured to be coupled to a first terminal of a primary winding of a transformer;

a first diode coupled between the drain of the first switching transistor and a second terminal of the primary winding, wherein the first diode is configured to limit a voltage at the drain of the first switching transistor to a pre-determined voltage;

a switching circuit coupled between the second switching transistor and the second terminal of the primary winding, wherein the switching circuit is configured to discharge a gate-source capacitor of the second switching transistor when the voltage at the drain of the first switching transistor is at the pre-determined voltage.

17. The circuit of claim 16, wherein the switching circuit comprises:

a bipolar junction transistor (BJT) comprising an emitter coupled to a gate of the second switching transistor, and a collector coupled to the source of the second switching transistor; and a first resistor and a second diode coupled in series between a base of the BJT and the second terminal of the primary winding.

18. The circuit of claim 17, further comprising:

a third diode; and a fourth diode, wherein the fourth diode and the third diode are coupled in series between the emitter of the BJT and a first voltage terminal.

19. The circuit of claim 18, wherein the first voltage terminal is coupled to a DC voltage source.

20. The circuit of claim 18, wherein the first voltage terminal is coupled to a pulse width modulator.

21. The circuit of claim 18, further comprising a driver circuit coupled between a gate of the first switching transistor and a pulse width modulator.

22. The circuit of claim 17, further comprising a second resistor coupled between the emitter of the BJT and the gate of the second switching transistor.

23. The circuit of claim 22, further comprising a third resistor coupled between the emitter of the BJT and the second terminal of the primary winding.

24. The circuit of claim 23, further comprising a start-up cell coupled to the source of the second switching transistor.

25. The circuit of claim 16, wherein the first switching transistor and the second switching transistor have different voltage ratings.

26. The circuit of claim 16, further comprising the transformer.

27. A method of switching a power circuit comprising:

turning off a first switching transistor, wherein the first switching transistor is coupled in series with a second switching transistor between a reference voltage and a primary winding of a transformer, wherein the second switching transistor is coupled between the primary winding and the first switching transistor;

clamping a voltage at a drain of the first switching transistor to a bus voltage provided to the primary winding; and turning off the second switching transistor after the voltage at the drain of the first switching transistor is above a pre-determined threshold.

28. The method of claim 27, wherein the clamping is performed by a diode coupled between the drain of the first switching transistor and the primary winding.

29. The method of claim 28, wherein the turning off the second switching transistor comprises:

turning on a third transistor; and discharging a gate-source capacitor of the second switching transistor through a conductive path comprising the third transistor, a resistor, and a second diode.

30. The method of claim 29, wherein the third transistor is a bipolar junction transistor (BJT).

* * * * *